United States Patent [19]
Chenoweth

[11] Patent Number: 6,076,681
[45] Date of Patent: *Jun. 20, 2000

[54] MICROCHIP CARRIER TAPE

[75] Inventor: Dean B. Chenoweth, Minnetonka, Minn.

[73] Assignee: Advantek, Inc., Minnetonka, Minn.

[*] Notice: This patent issued on a continued prosecution application filed under 37 CFR 1.53(d), and is subject to the twenty year patent term provisions of 35 U.S.C. 154(a)(2).

[21] Appl. No.: 09/033,293

[22] Filed: Mar. 2, 1998

[51] Int. Cl.⁷ .................................................. B65D 73/02
[52] U.S. Cl. .......................................... 206/714; 206/725
[58] Field of Search .................................... 206/330, 564, 206/565, 713, 714, 716, 722–725, 726–728, 820

[56] References Cited

U.S. PATENT DOCUMENTS

| | | |
|---|---|---|
| 4,564,880 | 1/1986 | Christ et al. . |
| 5,076,427 | 12/1991 | Thomson et al. . |
| 5,152,393 | 10/1992 | Chenoweth . |
| 5,234,104 | 8/1993 | Schulte et al. ............................ 206/714 |
| 5,265,723 | 11/1993 | Chenoweth . |
| 5,361,901 | 11/1994 | Schenz et al. ............................ 206/714 |
| 5,418,692 | 5/1995 | Nemoto .................................... 206/725 |
| 5,425,838 | 6/1995 | Chenoweth et al. . |
| 5,499,717 | 3/1996 | Hayashi .................................... 206/722 |

FOREIGN PATENT DOCUMENTS 6255673  9/1994  Japan ...................................... 206/330

*Primary Examiner*—Paul T. Sewell
*Assistant Examiner*—Luan K. Bui
*Attorney, Agent, or Firm*—Burd, Bartz & Gutenkauf

[57] ABSTRACT

A carrier tape has a plurality of pockets longitudinally spaced with transverse bridges for accommodating microchips. The tape has a bottom wall having upright corner supports and platforms that engage and retain the microchip with a pocket and space leads connected to the microchip from the side walls, end walls and bottom wall of the tape. A cover tape is releasably attached to side flanges and bridges of the carrier tape to close the top of the pockets and retain the positions of the microchips in the pockets. A hole in the bottom wall of the tape allows optical readings to verify the position of the microchip.

16 Claims, 4 Drawing Sheets

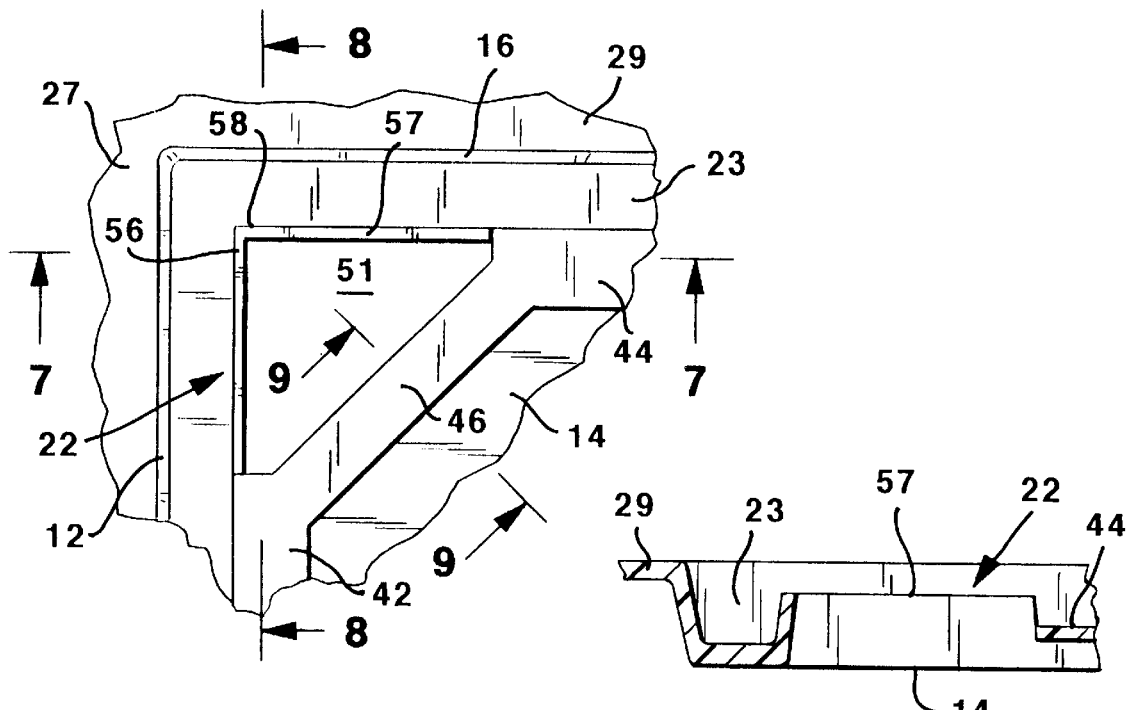
FIG.6
FIG.7
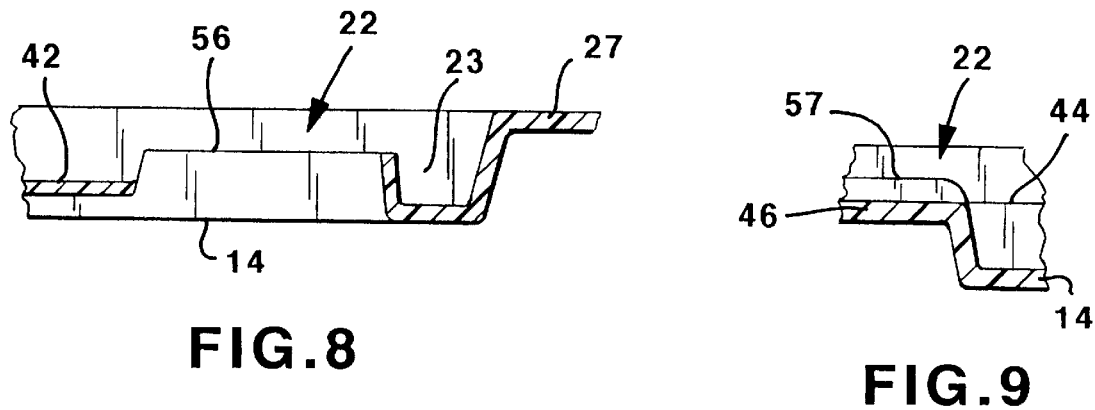
FIG.8
FIG.9

MICROCHIP CARRIER TAPE

FIELD OF THE INVENTION

The invention relates to carrier tapes having pockets for accommodating electronic components, such as microchips having lateral leads. The carrier tapes have supports that position the microchips within the pockets. Cover tapes heat sealed to the carrier tapes confine the microchips in the pockets and retain the microchips on the supports.

BACKGROUND OF THE INVENTION

Electronic components have been packaged in carrier tapes provided with cavities for receiving the components and covered with foil. G. J. Scholten et al in U.S. Pat. No. 4,712,676 discloses an example of a carrier tape having cavities for accommodating electronic components. A covering tape secured to the carrier tape encloses the electronic components within the cavities. The covering tape is a hot-adhesive material that is welded by heat to the opposite edges of the carrier tape. Additional tapes for storing electronic components are disclosed by J. F. Ball in U.S. Pat. No. 4,781,953 and J. H. Thomson et al in U.S. Pat. No. 5,076,427.

D. B. Chenoweth in U.S. Pat. No. 5,152,393 discloses microchip carrier tapes having lateral and transverse ridges and support members extended angularly between adjacent ends of the ridges in the bottom of pockets to retain microchips in the pockets. A microchip in each pocket is located on the support members to elevate the microchip above the bottom wall of the carrier tape. The ridges restrict lateral and longitudinal movements of the microchip so that the leads extended outwardly from the body of the microchips do not engage any part of the carrier tape. A cover tape heat sealed to the longitudinal flanges of the carrier tape retains the microchip on the support members and restricts vertical movements of the microchip in the pocket.

D. B. Chenoweth and T. B. Zbekowski in U.S. Pat. No. 5,425,835 disclose a heat sealing apparatus operable to heat seal longitudinal edges of a cover tape to the side flanges of a carrier tape and heat seal separate portions of the cover tape to the bridges between adjacent pockets in the carrier tape. The bridge seals limit in and out movements of the cover tape relative to the pockets so as to confine and limit movements of the microchips in the pockets.

An integrated circuit known as an electronic flat pack or microchip 24, shown in FIGS. 1 and 2, has body 25 encapsulating the electronic circuits and connectors or leads 26. One or more microchips mounted on circuit boards are connected to printed circuits through leads 26. The circuit boards are designed to be relatively small in size with the microchips and other electronic components crowded together into the smallest compatible space. The lateral or outward extend of leads 26 is minimized by having leads 26 extend downwardly from the edge 38 of body 25 as shown in FIG. 2. The outer peripheral walls 39 and 40 of body 25 tapers outwardly terminating in peripheral edge 38. A small inverted V-shaped space 41 is between leads 26 and wall 40. This space is too small to accommodate the inverted V-shaped ridges of the carrier tapes disclosed in U.S. Pat. No. 5,076,427 and 5,152,393. The microchip 24 does not rest on the shoulders adjacent the ridges as the space 41 between leads 26 and wall 40 cannot accommodate the width of the inverted V-shaped ridges. The leads 26 engage the ridges making these carrier tapes incompatible with the structure of microchip 24.

SUMMARY OF THE INVENTION

The invention is directed to a carrier tape and cover tape adapted to carry one or more microchips having a body and leads close to the outer peripheral wall of the body so as to prevent damage to the microchips and the leads thereon and limit movements to and retain orientation of the microchips relative to the carrier tape. A cover tape joined to the top of the carrier tape cooperates with corner supports on the carrier tape to minimize movements of the microchips and prevent damage to the microchip leads.

The carrier tape is an elongated ribbon of plastic material having a plurality of longitudinally separated pockets for accommodating microchips. The microchips have short lateral and downwardly directed leads located in close proximity to the side walls of the body of the microchip. The tape has a flat bottom wall joined to upright transverse side walls and upright end walls to define each pocket and corners of each pocket. Corner supports extend upwardly from the bottom wall adjacent each corner of the pocket to maintain the lateral location of the microchip in the pocket and prevent the leads from engaging the side and end walls of the tape. Platforms support the microchip in the pocket with the leads spaced from the bottom, side, and end walls of the tape to prevent damage to the leads. Each corner support has corner members formed from portions of the bottom wall that are angularly disposed relative to each other and engage a corner of the microchip to limit lateral and longitudinal movements of the microchip relative to the tape. A cover tape located over the carrier tape closes the pockets and engages the microchips to restrict up and down movements of the microchips relative to the carrier tape whereby all movements of the microchips are restrained by the corner members, platforms, and cover tape. The cover tape is heat sealed to the side flanges and bridges of the carrier tape.

DESCRIPTION OF THE DRAWINGS

FIG. 6 is an enlarged top view of a corner area of the carrier tape;

FIG. 7 is a sectional view taken along line 7—7 of FIG. 6;

FIG. 8 is a sectional view taken along line 8—8 of FIG. 6;

FIG. 9 is a sectional view taken along line 9—9 of FIG. 6;

DESCRIPTION OF PREFERRED EMBODIMENT

Figure 1:
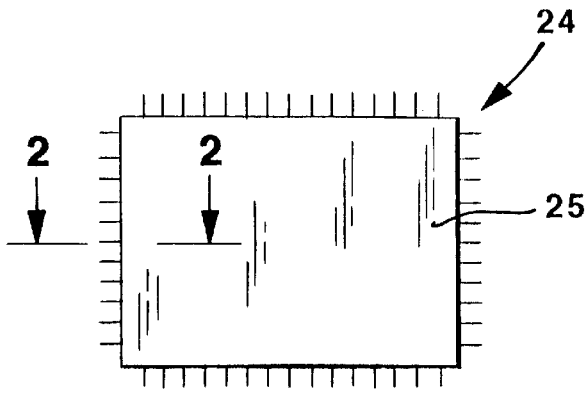
FIG. 1 is a top plan view of a microchip.
Figure 2:
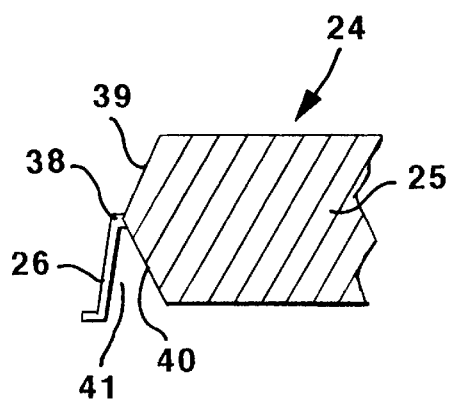
FIG. 2 is an enlarged sectional view taken along line 2—2 of FIG. 1.
Figure 3:
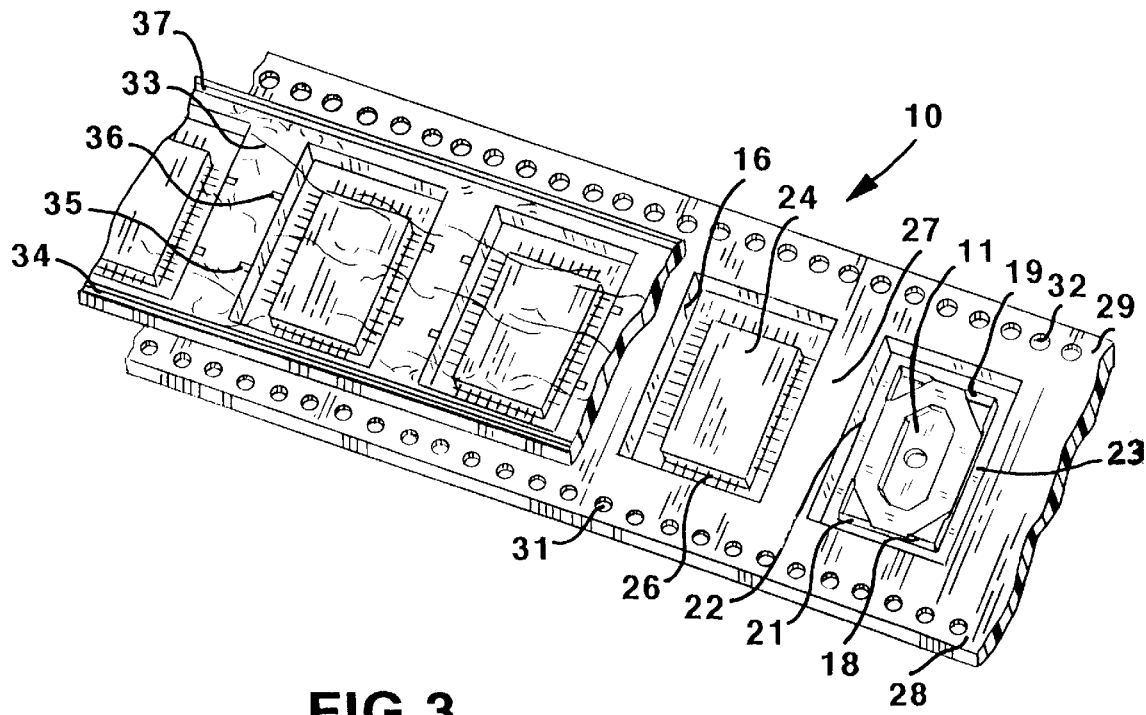
FIG. 3 is a perspective view of the microchip carrier tape of the invention supporting microchips and a cover tape sealed to the carrier tape to retain the microchip in confined positions on the carrier tape.
Figure 4:
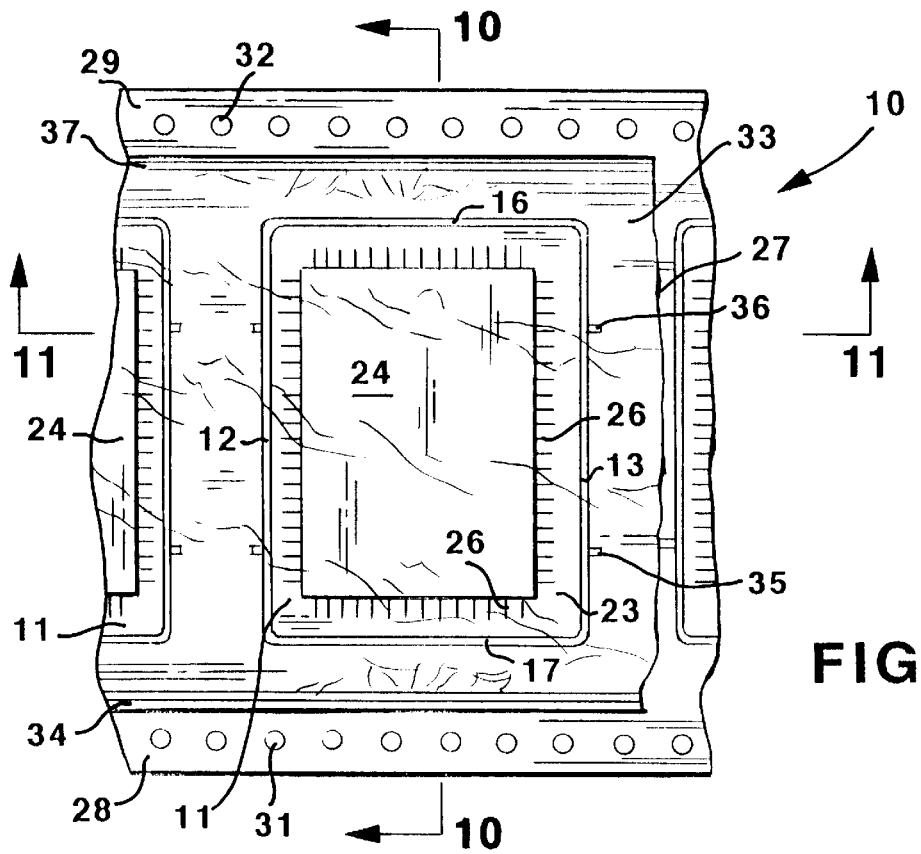
FIG. 4 is an enlarged top plan view of a portion of the carrier tape and cover tape supporting a microchips in confined positions on the carrier tape.

Referring to FIGS. 3 and 4, there is shown an elongated carrier tape indicated generally at 10 for accommodating electronic parts, shown as microchips 24 having outwardly and downwardly directed leads 26 located in close proximity to the body of the microchip. Tape 10 stores and maintains the orientation of the microchips while preventing damage to the leads. Tape 10 is a plastic strip of PVC or polystyrene plastic formed with a plurality of generally rectangular downwardly directed pockets 11. Other types of plastics can be used for tape 10. Tape 10 has upright side walls 12 and 13 joined to a flat bottom wall 14 and upright end walls 16 and 17 surrounding each pocket 11. The center portion of bottom wall 14 has a hole 15 to permit optical reading to verify the presents of a microchip in the pocket and position of microchip in the pocket. The top of each pocket 11 is open to allow microchips to be placed into the pockets.

Figure 5:
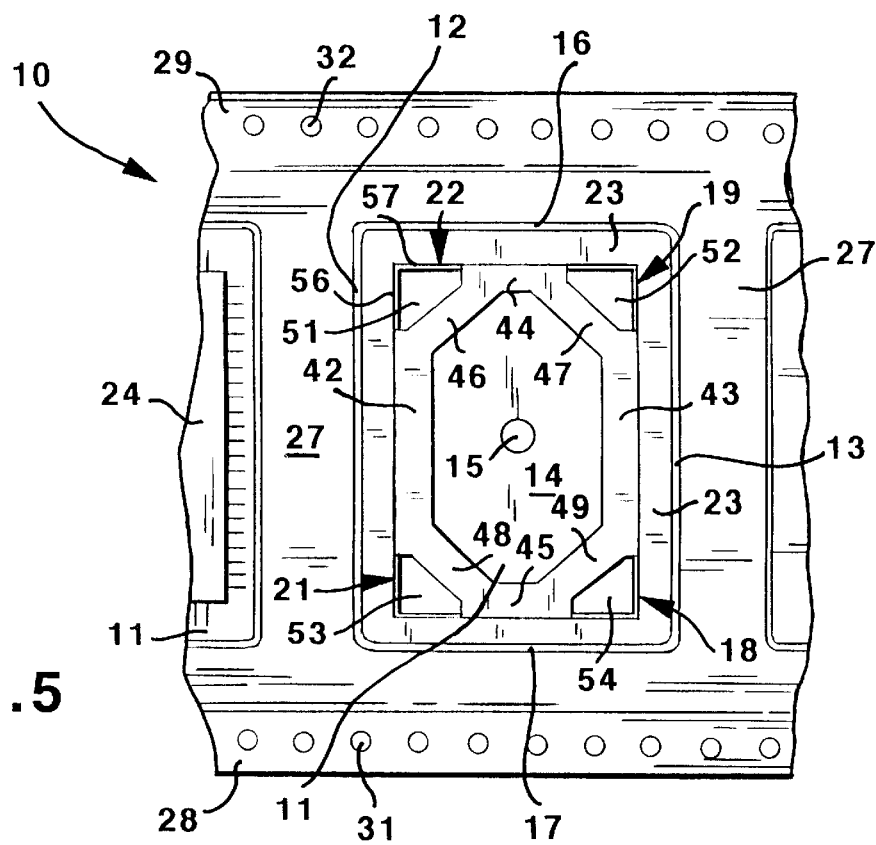
FIG. 5 is an enlarged top plan view of a portion of the carrier tape.

As shown in FIG. 5, four corner supports or upright ears 18, 19, 21 and 22 are located in the four corner sections of pocket 11. Platforms 42, 43, 44 and 45 extended upwardly from bottom wall 14 support microchip in pocket 11 and space leads 26 above bottom wall 14 in groove 23. Platforms 42, 43, 44 and 45 have flat upper faces located in a common plane. The bottom surface of body 25 of microchip 24 is in flat surface engagement with the upper faces of platforms 42, 43, 44 and 45. Platform 42 linearly extends between corner supports 21 and 22 with its outer edge coextensive with adjacent ears of supports 21 and 22. Platform 43 linearly extends between corner supports 18 and 19 with its outer edge coextensive with adjacent ears of supports 21 and 22. As shown in FIGS. 7, 8 and 9, ears or flanges 56 and 57 of corner support 22 have linear top edges located above the upper surfaces of platforms 42, 44 and 46. Corner supports 18, 19 and 21 have ears or flanges the same as ears 56 and 57 or corner support 22. Platforms 44 and 45 extend between corner supports 19 and 22 and 18 and 21. Diagonal platforms 46, 47, 48 and 49 connect the side and end platforms 42, 43 and 44, 45 to complete a continuous platform structure that supports the sides and ends of microchip 24 in pocket 11. Diagonal platforms 46, 47, 48, and 49 also increase transverse bending and twisting strength of tape 10. Ears 18, 19, 21 and 22 nest around the corners of the body 25 of a microchip 24 to laterally and longitudinally retain microchip 24 in pocket 11. Leads 26 are spaced from the adjacent side and end walls 12, 13, 16, 17 and are located above bottom wall 14 so that leads 26 do not engage any walls of the tape and therefore are not subject to forces that can bend, relocate, dislodge or break one or more leads.

An enlarged corner support 22 is shown in FIG. 6. Corner supports 18, 19 and 21 have the same structure as corner support 22. Corner support 22 has a pair of flanges, or lips 56 and 57 joined together with an apex section 58. Flanges 56 and 57 are generally normal to each other and inclined projected upwardly from bottom wall 14. Flanges 56 and 57 are thin, flat and single sheet members that fit into space 41 between microchip wall 40 and leads 26. The flanges 56 and 57 have substantially the same thickness as bottom wall 14 of tape 10. As shown in FIG. 7 to 9, the top edges of corner section 22 are below the horizontal plane of the top of carrier tape 10. Corner section 22 is an right angle section of bottom wall 14 formed upwardly with forming and cutting dies of a press. The forming of corner section 22 from material of bottom wall 14 leaves triangular openings 51, 52, 53 and 54 in wall 14. The top edges of flanges 56 and 57 have generally linear shapes are generally parallel to the upper flat faces of platforms 42–28. Flanges 56 and 57 having the same thickness as bottom wall 14. The right angle relationship between flanges 56 and 57 maintain flanges 56 and 57 in their upright positions.

Figure 10:
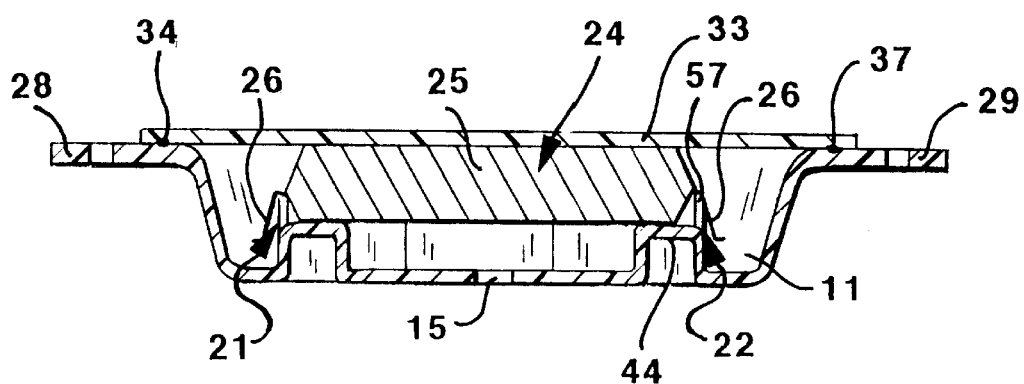
FIG. 10 is a sectional view taken along line 10—10 of FIG. 4.
Figure 11:
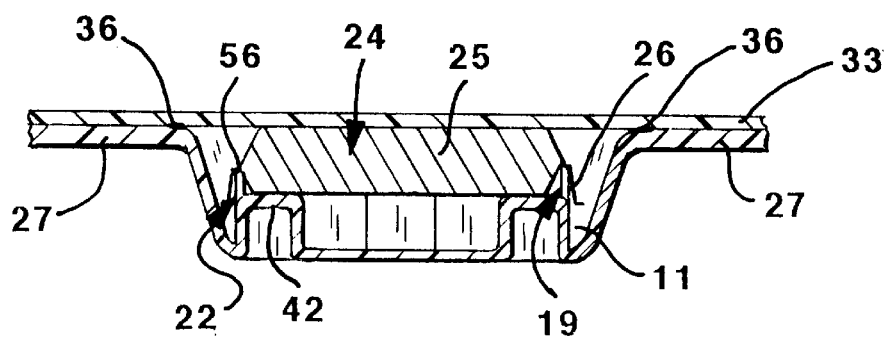
FIG. 11 is a sectional view taken along line 11—11 of FIG. 4.
Figures 12, 13:
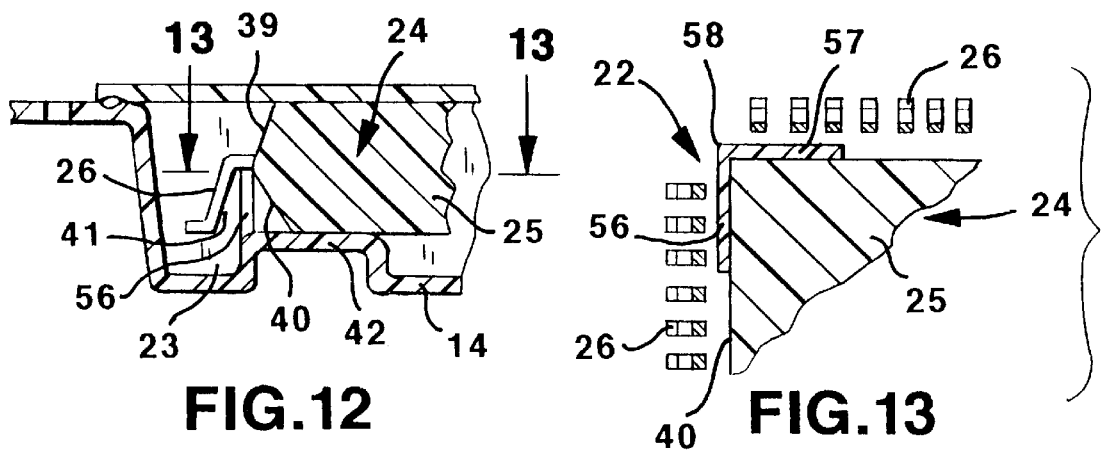
FIG. 12 is an enlarged sectional view of a corner retainer of the microchip carrier tapes.
FIG. 13 is an enlarged sectional view taken along line 13—13 of FIG. 12.

As shown in FIGS. 10 to 13, microchip 24 located in pocket 11 rests on platforms 42–48 which holds microchip 24 in a horizontal position in pocket 11 with the top flat surface of microchip 24 located in the horizontal plane of the top surface of carrier tape 10. Flanges 56 and 57 of the corner support 22 being relatively thin fit into the small space 41 between outer peripheral wall 40 of body and leads 26. As shown in FIG. 13, flanges 56 and 57 bear against normally disposed corner sections of wall 40 of body 25. Corner supports 18, 19 and 21 have normally disposed flanges the same as flanges 56 and 57 that engage corner sections of body 25 to prevent lateral and longitudinal shifting of microchip 24 relative to corner supports 18, 19, 21 and 22.

Cover tape 33 is a flexible and transparent plastic ribbon that allows visual and electronic microchip inspection. The ribbon is made of static dissepative plastic sheet materials. The ribbon can have a heat or pressure sensitive coating that facilitates bonding to the opposite side edges and bridges of carrier tape 10. Cover tape 33 extends longitudinally over carrier tape 10 closing the open tops of pockets 11. Cover tape 33 contacts the flat top of microchip 24 as shown in FIGS. 10, 11 and 12. A rectangular portion of cover tape 33 is in surface engagement with the flat top of microchip 24 to firmly maintain microchip 24 on platforms 42–48 and engagement with corner supports 18, 19, 21 and 22. Continuous heat seals 34 and 37 secure opposite edges of cover tape 33 to flanges 28 and 29 of carrier tape 10. Short heat seals 36 secure middle sections of cover tape 33 to outer portions of each bridge 27 to limit up and down movements of cover tape 33 relative to pocket 11 thereby retain microchip 24 in a fixed relationship with corner supports 18, 19, 21 and 22. A heat sealing apparatus disclosed in U.S. Pat. No. 5,425,838 can be used to heat seal the cover tape 33 to the carrier tape 10.

Modifications of the parts, arrangement of parts, size of parts and materials of the microchip carrier tape, corner supports and cover tape may be made by those skilled in the art without departing from the invention as set forth in the appended claims.

What is claimed is:

1. A carrier tape for microchips having a body and leads, said body having corner portions and side walls, said leads extended downwardly from the side walls and located in close relationship relative to the side walls, comprising: an elongated ribbon of tape having a plurality of pockets along the length thereof for accommodating microchips, said tape having a bottom wall, side walls and end walls defining each pocket and corner sections thereof, transverse bridges separating adjacent pockets, upright means joined to the bottom wall located in the corner sections of each pocket for restraining lateral, rotational and longitudinal movements of the microchip relative to the tape and spacing the leads from the side and end walls of the tape, said upright means comprising first and second upright single wall flanges adapted to be positioned between the leads and side walls of the body of the microchip and engageable with said side walls of the body, and upwardly directed apex sections joined to the first and second upright single wall flanges, and platform means joined to the bottom wall for supporting the microchip in the pocket, said platform means being located above the bottom wall to space the leads of the microchip above the bottom wall of the tape, said flanges having top edges located above the platform means and opposite ends, said platform means having diagonal platforms extended between the opposite ends of the flanges to support the corner portion of the body and retain the upright positions of the single wall flanges, and generally triangular openings between the first and second flanges and the diagonal platforms.

2. The carrier tape of claim 1 wherein: the first and second flanges are generally normal to each other.

3. The carrier tape of claim 1 wherein: the first and second flanges each have a thickness substantially the same as the thickness of the bottom wall of the carrier tape.

4. The carrier tape of claim 1 wherein: each pocket has a generally rectangular shape with right angle corners, said first and second flanges of each corner support being right angle members located adjacent a corner of the pocket.

5. The carrier tape of claim 1 wherein: the flanges have linear top edges, and said platform means having generally flat upper faces located in a plane generally parallel to the linear top edges of the flanges.

6. The carrier tape of claim 1 wherein: the platform means includes side platforms and end platforms joined to adjacent ends of the diagonal platforms.

7. In combination a microchip carrier tape cover tape and at least one microchip having a body having site walls and corner portions and downwardly directed leads joined to the side walls of the body, said leads being located in close relation relative to the side walls of the body, an elongated ribbon of tape having longitudinal side flanges and a plurality of pockets located between the flanges for accommodating microchips, said tape having a bottom wall, side walls, and end walls joined to each other to define each pocket with corner sections thereof, transverse bridges joined to the side flanges separating adjacent pockets, upright means joined to the bottom wall located in the corner sections of each pocket for retaining the microchip in the pocket with the leads spaced from the side and end walls of the tape, said upright means restraining lateral, rotational and longitudinal movements of the microchip relative to the tape, said upright means comprising first and second upright single wall flanges positioned between the leads and side walls of the body of the microchip and in engagement with said body, and an upwardly directed apex section joined to the first and second upright single wall flanges, platform means joined to the bottom wall for supporting the microchip in the pocket, said platform means being located above the bottom wall to space the leads of the microchip above the bottom wall of the tape, said flanges having top edges located above the platform means and opposite ends, said platform means having diagonal platforms extended between the opposite ends of the flanges to support the corner portions of the body of the microchip and retain the upright position of the single wall flanges, generally triangular openings between the first and second upright single wall flanges and the diagonal platforms a cover tape located longitudinally over the carrier tape closing the pockets and in engagement with the body of the microchip to hold the microchip on the platform means and prevent up and down movements of the microchip relative to the carrier tape and for maintaining the lower portion of the side walls of the body in engagement with the first and second flanges; and means securing the cover tape to the side flanges and bridges of the carrier tape.

8. The combination of claim 7 wherein: the first and second flanges are generally normal to each other.

9. The combination of claim 7 wherein: the first and second flanges each have a thickness substantially the same as the thickness of the bottom wall of the tape.

10. The combination of claim 7 wherein: the flanges have linear top edges, and said platform means having, generally flat upper faces located generally parallel to the linear top edges of the flanges.

11. The combination of claim 7 wherein: the platform means includes side platforms, and end platforms, said side and end platforms having adjacent ends, and said diagonal platforms being joined to adjacent ends of the side and end platforms.

12. In combination a microchip having a generally flat body, said body having corner portions and outer peripheral side walls that taper outwardly terminating in a peripheral edge, a plurality of leads connected to the body and extended downwardly from the peripheral edge of the side walls, said leads being located laterally and in close contiguous relation to a lower portion of the side walls, an elongated ribbon of tape having longitudinal side flanges and a plurality of pockets located between the side flanges along the length of the tape for accommodating microchips, said microchip being located in one of the pockets, said tape having a bottom wall, side walls, and end walls defining each pocket and corner section thereof, transverse bridges joined to the side flanges separating adjacent pockets, upright means joined to the bottom wall located in the corner sections of each pocket for retaining the microchip in said one of the pockets with the leads spaced from the side and end walls of the tape, said upright means restraining lateral, rotational, and longtiudinal movements of the microchip relative to the tape, said upright means comprising first and second upright single wall flanges positioned between the leads and said lower portion of the side walls of the body of the microchip and engageable with said lower portion of the side walls of the body, and an upwardly directed apex section joined to the first and second upright single wall flanges, platform means joined to the bottom wall for supporting the microchip in the pocket, said platform means being located above the bottom wall to space the leads of the microchip above the bottom wall of the tape, said flanges having top edges located above the platform means and opposite ends, said platform means having diagonal platforms extended between the opposite ends of the flanges to support the corner portion of the body and retain the upright positions of the single wall flanges, generally triangular openings between the first and second upright single wall flanges and the diagonal platforms, a cover tape located longitudinally over the tape closing the pockets and in engagement with the body of the microchip to hold the microchip on the platform means and restrict up and down movements of the microchip relative to the tape and for maintaining the lower portion of the side walls of the body in engagement with the first and second flanges; and means securing the cover tape to the side flanges and bridges of the tape.

13. The combination of claim 12 wherein: the first and second flanges are generally normal to each other.

14. The combination of claim 12 wherein: the first and second flanges each have a thickness substantially the same as the thickness of the bottom wall of the tape.

15. The combination of claim 12 wherein: the flanges have linear top edges, and said platform means having generally flat upper faces located generally parallel to the linear top edges of the flanges.

16. The combination of claim 12 wherein: the platform means includes side platforms, and end platforms, said side and end platforms having adjacent ends, and said diagonal platforms being joined to the adjacent ends of the side and end platforms.

* * * * *